United States Patent
Guo et al.

(10) Patent No.: US 10,564,757 B2
(45) Date of Patent: Feb. 18, 2020

(54) FORCE TOUCH SENSOR, DISPLAY DEVICE AND DRIVING METHOD THEREOF

(71) Applicant: BOE TECHNOLOGY GROUP CO., LTD., Beijing (CN)

(72) Inventors: Yuzhen Guo, Beijing (CN); Xue Dong, Beijing (CN); Haisheng Wang, Beijing (CN); Chun Wei Wu, Beijing (CN); Yingming Liu, Beijing (CN); Rui Xu, Beijing (CN); Yanan Jia, Beijing (CN); Lijun Zhao, Beijing (CN); Yunke Qin, Beijing (CN); Pinchao Gu, Beijing (CN); Changfeng Li, Beijing (CN); Xiaoliang Ding, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/756,966

(22) PCT Filed: Aug. 11, 2017

(86) PCT No.: PCT/CN2017/097112
§ 371 (c)(1),
(2) Date: Mar. 1, 2018

(87) PCT Pub. No.: WO2018/133397
PCT Pub. Date: Jul. 26, 2018

(65) Prior Publication Data
US 2019/0087046 A1   Mar. 21, 2019

(51) Int. Cl.
*G09G 3/36* (2006.01)
*G06F 3/041* (2006.01)
(Continued)

(52) U.S. Cl.
CPC .......... *G06F 3/0414* (2013.01); *G06F 3/044* (2013.01); *G06F 3/0412* (2013.01);
(Continued)

(58) Field of Classification Search
CPC .......... G09G 3/36; G06F 3/041; G06F 3/045; G01R 27/26
See application file for complete search history.

(56) References Cited

U.S. PATENT DOCUMENTS 8,247,947 B2   8/2012 Elmegreen et al.
8,405,279 B2   3/2013 Elmegreen et al.
(Continued)

FOREIGN PATENT DOCUMENTS

CN   101558370 A   10/2009
CN   102640314 A   8/2012
(Continued)

OTHER PUBLICATIONS

International Search Report & Box V of Written Opinion, for PCT Patent Application No. PCT/CN2017/097112, dated Nov. 16, 2017, 17 pages.
(Continued)

*Primary Examiner* — Pegeman Karimi
(74) *Attorney, Agent, or Firm* — Kinney & Lange, P.A.

(57) ABSTRACT

The present disclosure provides a force touch sensor, a display device and a driving method thereof. The force touch sensor comprises a driving electrode, a sensing electrode, a piezoelectric material layer and a piezoresistive material layer, wherein the piezoelectric material layer and the piezoresistive material layer are disposed between the driving electrode and the sensing electrode.

17 Claims, 7 Drawing Sheets

(51) Int. Cl.
*H01L 41/113* (2006.01)
*G06F 3/044* (2006.01)
*H01L 27/32* (2006.01)
*H01L 41/187* (2006.01)

(52) U.S. Cl.
CPC ........ *G06F 3/0416* (2013.01); *H01L 41/1132* (2013.01); *G06F 2203/04102* (2013.01); *G06F 2203/04104* (2013.01); *G06F 2203/04105* (2013.01); *H01L 27/323* (2013.01); *H01L 41/187* (2013.01); *H01L 2251/5338* (2013.01)

(56) References Cited

U.S. PATENT DOCUMENTS

| | | | |
|---|---|---|---|
| 9,618,778 B2 | 4/2017 | Jing | |
| 2010/0013785 A1 | 1/2010 | Murai et al. | |
| 2010/0238114 A1* | 9/2010 | Vartanian | G06F 3/016 345/168 |
| 2010/0328984 A1 | 12/2010 | Elmegreen et al. | |
| 2012/0090409 A1* | 4/2012 | Luthje | G01L 1/18 73/862.627 |
| 2013/0082970 A1* | 4/2013 | Frey | G06F 3/0414 345/173 |
| 2015/0226618 A1 | 8/2015 | Shih | |
| 2015/0287904 A1* | 10/2015 | White | H01L 41/113 310/319 |
| 2016/0246081 A1 | 8/2016 | Jing | |
| 2017/0262099 A1* | 9/2017 | Nathan | G06F 3/044 |
| 2017/0357346 A1 | 12/2017 | Wang | |
| 2018/0046298 A1* | 2/2018 | Weng | G06F 3/044 |
| 2018/0095582 A1* | 4/2018 | Hwang | G06F 3/0412 |
| 2018/0136762 A1* | 5/2018 | Jeong | G02F 1/133305 |

FOREIGN PATENT DOCUMENTS

| | | |
|---|---|---|
| CN | 103454799 A | 12/2013 |
| CN | 105224126 A | 1/2016 |
| CN | 105549245 A | 5/2016 |
| CN | 205788139 U | 12/2016 |
| CN | 106814912 A | 6/2017 |
| KR | 101649986 B1 | 8/2016 |

OTHER PUBLICATIONS

First Chinese Office Action dated Apr. 3, 2019, received for corresponding Chinese Application No. 201710035076.1.

* cited by examiner

FORCE TOUCH SENSOR, DISPLAY DEVICE AND DRIVING METHOD THEREOF

CROSS REFERENCE TO RELATED APPLICATIONS

The present application is the national phase of PCT Application No. PCT/CN2017/097112 filed on Aug. 11, 2017, which in turn claims a priority from Chinese Patent Application No. 201710035076.1, filed on Jan. 17, 2017, with a title of "Force touch sensor, display device and driving method thereof", the entire contents thereof being incorporated herein by reference.

TECHNICAL FIELD

The present disclosure relates to the technical field of display, and particularly to a force touch sensor, a display device and a driving method thereof.

BACKGROUND

With the development of information technology, mobile terminals have increasingly rich functions, and various applications of new technologies and new functions are presented in different manners. Force touch (3D-touch) technology can sense the intensity of pressing, and thereby can achieve various functions based on different intensities, increasing user's experience.

Currently, a force touch sensor based on piezoelectric effect is typically used to achieve multi-point touch and pressure sensing functions. The force touch sensor comprises a driving electrode, a sensing electrode, and a piezoelectric material layer disposed between the driving electrode and the sensing electrode, wherein the piezoelectric material layer is an insulator.

When a pressure is applied to the force touch sensor, positive and negative charges are respectively accumulated at two ends of the piezoelectric material layer in the pressure-applying direction, and the magnitude of the pressure applied is determined according to the electrical signal generated by the positive and negative charges; wherein, although the positive and negative charges are accumulated at two ends of the piezoelectric material layer respectively, the piezoelectric material layer is still an insulator.

However, when the force touch sensor is applied to a flexible display device, because bending will also generate an electrical signal, a misrecognition is liable to occur in pressure sensing when the flexible display device is bent.

SUMMARY

Embodiments of the present disclosure comprise the following technical solutions:

In a first aspect, the present disclosure provides a force touch sensor comprising a driving electrode, a sensing electrode, a piezoelectric material layer and a piezoresistive material layer, wherein the piezoelectric material layer and the piezoresistive material layer are disposed between the driving electrode and the sensing electrode.

Herein, "a piezoelectric material layer" and "a piezoresistive material layer" mean "at least one piezoelectric material layer" and "at least one piezoresistive material layer" respectively.

Optionally, the force touch sensor has a structure in which the driving electrode, the piezoresistive material layer, the piezoelectric material layer and the sensing electrode are laminated in sequence.

Or optionally, the force touch sensor has a structure in which the driving electrode, the piezoelectric material layer, the piezoresistive material layer and the sensing electrode are laminated in sequence.

Optionally, the force touch sensor has a structure comprising a plurality of piezoelectric material layers and at least one piezoresistive material layer, in which the plurality of piezoelectric material layers and the at least one piezoresistive material layer are laminated alternately.

Optionally, the force touch sensor has a structure in which the driving electrode, the piezoelectric material layer, the piezoresistive material layer, the piezoelectric material layer and the sensing electrode are laminated in sequence.

Optionally, the force touch sensor comprises a plurality of driving electrodes, each of which extends along a first direction; and the force touch sensor comprises a plurality of sensing electrodes, each of which extends along a second direction; wherein the first direction intersects with the second direction.

Optionally, orthographic projections of the piezoelectric material layer and the piezoresistive material layer along a direction perpendicular to the piezoelectric material layer are completely overlapped with each other.

Optionally, a material of the piezoelectric material layer includes a piezoelectric ceramic material and/or an organic piezoelectric material; further, the piezoelectric ceramic material includes at least one selected from the group consisting of zinc oxide, aluminum nitride and lead zirconate titanate; and the organic piezoelectric material includes polyvinylidene fluoride.

In a second aspect, the present disclosure provides a display device comprising a display panel and the force touch sensor according to the first aspect, wherein the force touch sensor is disposed on the display panel.

Optionally, the force touch sensor is integrated into the display panel.

Further, the display panel is a flexible organic light emitting diode (OLED) display panel.

Further optionally, the flexible OLED display panel comprises a flexible substrate and a light emitting device disposed on the flexible substrate; and the force touch sensor is disposed on one side of the flexible substrate close to the light emitting device.

Or optionally, the flexible OLED display panel comprises a flexible substrate and a light emitting device disposed on the flexible substrate; and the force touch sensor is disposed on one side of the flexible substrate away from the light emitting device.

Or optionally, the flexible OLED display panel comprises a flexible substrate, a light emitting device disposed on the flexible substrate and a thin film transistor disposed between the flexible substrate and the light emitting device; and the force touch sensor is disposed between the flexible substrate and the thin film transistor.

Or optionally, the flexible OLED display panel comprises a flexible substrate, a light emitting device disposed on the flexible substrate and a thin film transistor disposed between the flexible substrate and the light emitting device; the light emitting device comprises an anode, an organic material function layer and a cathode; the force touch sensor is disposed between the thin film transistor and the anode; the thin film transistor, the force touch sensor and the anode are disposed in lamination, and the anode is electrically connected with a drain electrode of the thin film transistor through a via hole.

Or optionally, the flexible OLED display panel comprises a flexible substrate, a light emitting device disposed on the flexible substrate and a packaging thin film and a packaging cover plate for packaging the light emitting device; and the force touch sensor is disposed between the packaging thin film and the packaging cover plate.

Further optionally, the piezoelectric material layer and the piezoresistive material layer are disposed on a display area of the flexible OLED display panel and cover the display area; and the force touch sensor is transparent.

Or optionally, the piezoelectric material layer and the piezoresistive material layer are disposed on a non-light-emitting area of the display area and have a network structure; and both the driving electrode and the sensing electrode are transparent electrodes.

In a third aspect, the present disclosure provides a method for driving the display device according to the second aspect, comprising: a touch stage, comprising applying a driving signal to the driving electrode line by line, receiving a touch sensing signal by the sensing electrode, and determining a touch position according to a signal change on the sensing electrode and the driving electrode to which the driving signal is applied; and a pressure sensing stage, in which the piezoelectric material layer of an area under stress generates an electrical signal, while a resistance of the piezoresistive material layer of the area under stress decreases, comprising inputting a constant voltage signal into the driving electrode, allowing the sensing electrode to receive a voltage signal, and determining a pressure value at the touch position according to the voltage signal.

BRIEF DESCRIPTION OF DRAWINGS

To more clearly illustrate the technical solutions in the embodiments of the present disclosure or in prior art, the drawings to be used in the description of the embodiments or prior art will be briefly introduced below. Obviously, the drawings described are only some embodiments of the present disclosure, and for those skilled in the art, other drawings can be obtained according to these drawings without inventive efforts.

DESCRIPTION OF REFERENCE NUMBERS

01—touch stage; 02—pressure sensing stage; 100, 100'—force touch sensor; 110—driving electrode; 120—sensing electrode; 130, 130'—piezoelectric material layer; 140—piezoresistive material layer; 200—display area; 210—flexible substrate; 220—thin film transistor; 221—drain electrode; 222—via hole; 230—light emitting device; 231—anode; 232—organic material function layer; 233—cathode; 234—packaging thin film; 240—insulating layer; 300—packaging cover plate.

DETAILED DESCRIPTION

The technical solutions in embodiments of the present disclosure will be detailedly described below in combination with the drawings of the embodiments of the present disclosure. Obviously, the embodiments described are only a part of, not all of the embodiments of the present disclosure. All of other embodiments obtained by those skilled in the art based on the embodiments described, without inventive efforts, fall within the protection scope of the present disclosure.

Figure 1:
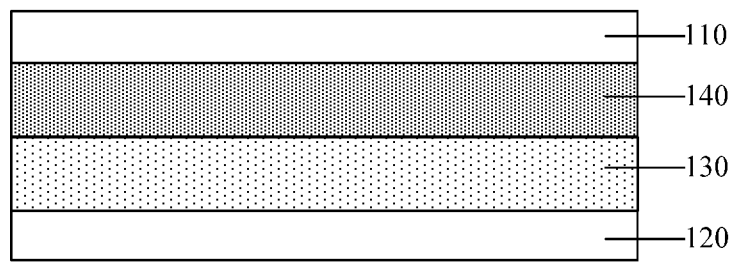
FIG. 1 is a structural schematic diagram I of a force touch sensor provided in an embodiment of the present disclosure.

The embodiments of the present disclosure provide a force touch sensor 100, as shown in FIG. 1, comprising a driving electrode 110, a sensing electrode 120, and a piezoelectric material layer 130 and a piezoresistive material layer 140 disposed between the driving electrode and the sensing electrode.

Here, the working principle of the force touch sensor 100 is as follows.

Figure 2:
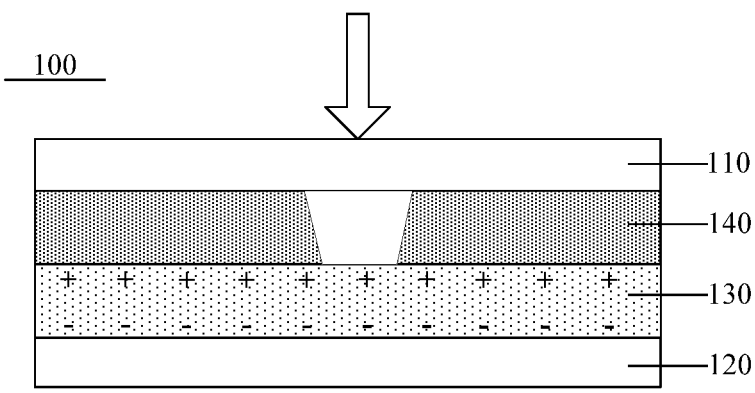
FIG. 2 is a schematic diagram I of a working principle of a force touch sensor provided in an embodiment of the present disclosure.

In a pressure sensing mode, as shown in FIG. 2, positive and negative charges are accumulated on the top and bottom surfaces of an area under stress of the piezoelectric material 130 layer respectively, producing an electrical signal, and the accumulation degree of charges is related to the magnitude of the force; while the resistance of the piezoresistive material layer 140 in the area under stress decreases, as if a conducting path is formed in the area under stress, so the piezoresistive material layer 140 in the area under stress can be regarded as a part of the electrode contacted therewith, and the electrical signal can be transmitted to the electrode contacted with the piezoresistive material layer 140; in addition, the resistance of the conducting path is related to the magnitude of the pressure. Based on the above two electrical effects, the magnitude of the pressure can be obtained.

Here, the greater the pressure applied, the more the amount of the charges accumulated on the top and bottom surfaces of the area under stress of the piezoelectric material layer 130 is, and the less the resistance of the conducting path formed by the piezoresistive material layer 140 in the area under stress is.

Figure 3:
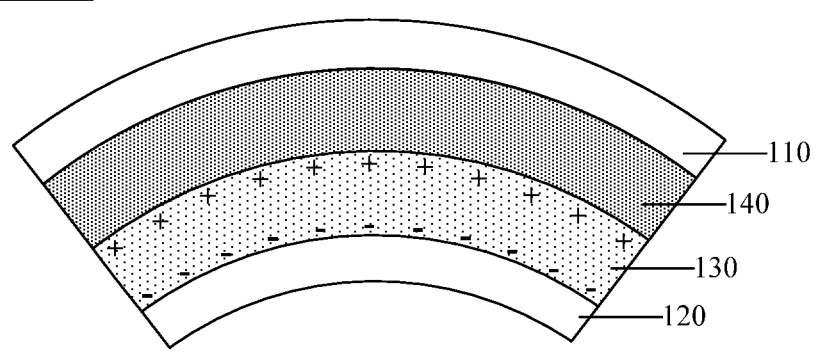
FIG. 3 is a schematic diagram II of a working principle of a force touch sensor provided in an embodiment of the present disclosure.

As shown in FIG. 3, when the force touch sensor 100 is bent, although the piezoelectric material layer 130 deforms such that positive and negative charges are accumulated on the top and bottom surfaces respectively due to the bending, the upper and lower parts of the piezoresistive material layer 140 are subjected to a pulling force and a pressure respectively (the force touch sensor 100 will be subjected to a centripetal force when being bent, and the centripetal force is present as a pulling force at the upper part of the piezoresistive material layer 140 and present as a pressure at the lower part of the piezoresistive material layer 140), such that the overall resistance will not decrease, and the conducting path will not open, thereby the electrical signal generated by the piezoelectric material layer 130 will not be transmitted to the electrode.

In a touch mode, when the force touch sensor 100 is a mutual capacitance sensor, the touch position can be determined according to the change in capacitance between the driving electrode 110 and the sensing electrode 120; and when the force touch sensor 100 is a self-capacitance sensor, the touch position is determined according to the change in capacitance between driving electrode 110 and ground and the change in capacitance between the sensing electrode 120 and ground respectively.

When the intensity of the touch is relatively great, because the piezoelectric material layer 130 can be regarded as an equivalent circuit in which a voltage source and a capacitor are connected in parallel, and the piezoresistive material layer 140 forms a conducting path in the area under stress such that the piezoresistive material layer 140 in the area under stress can be regarded as a part of the electrode contacted therewith, the touch position can thus be determined based on the capacitance change in the touch position.

When the intensity of the touch is relatively small, because the piezoelectric material layer 130 functions as an insulating dielectric layer (even if there is a force, the piezoelectric material layer 130 can still be regarded as an equivalent circuit in which a voltage source and a capacitor are connected in parallel), and the piezoresistive material layer 140 can be regarded as an insulating dielectric layer, the touch position can still be determined based on the capacitance change in the touch position.

Here, compared to the case where the intensity of the touch is relatively great, the detection range of touch capacitance change can be broadened in treating the electrical signal when the intensity of the touch is relatively small, as long as the capacitance change caused by the piezoresistive material layer 140 is within an allowable value.

It should be noted that, first, the upper and lower relative positions of the driving electrode 110 and the sensing electrode 120 are not limited, and the driving electrode 110 may be in an upper position or the sensing electrode 120 may be in an upper position (FIGS. 1-3 only illustrate the case where the driving electrode 110 is in an upper position and the sensing electrode 120 is in an lower position).

On this basis, the relative positions of the piezoelectric material layer 130 and the piezoresistive material layer 140 are not limited, and may be any combination (FIGS. 1-3 only illustrate the case where the piezoresistive material layer 140 is in an upper position and the piezoelectric material layer 130 is in a lower position).

Second, it should be appreciated by those skilled in the art that the piezoelectric material layer 130 and the piezoresistive material layer 140 should be disposed in lamination, that is, the piezoelectric material layer 130 and the piezoresistive material layer 140 should have an overlapped area.

In the force touch sensor 100 provided in the embodiments of the present disclosure, a piezoresistive material layer 140 is added on the basis of a piezoelectric material layer 130, therefore, on one hand, in the touch mode, whether the force is great or small, the recognition of the touch position based on capacitance change will be not influenced; on the other hand, in the pressure sensing mode, even if the force touch sensor 100 is bent such that positive and negative charges are accumulated on the top and bottom surfaces of the piezoelectric material layer 130 respectively, the overall resistance of the piezoresistive material layer 140 will not decrease because the upper and lower parts of the piezoresistive material layer 140 are subjected to a pulling force and a pressure respectively, and therefore the electrical signal generated by the piezoelectric material layer 130 will not be transmitted to the electrode, which can avoid misrecognition in pressure sensing due to bending.

Figure 4:
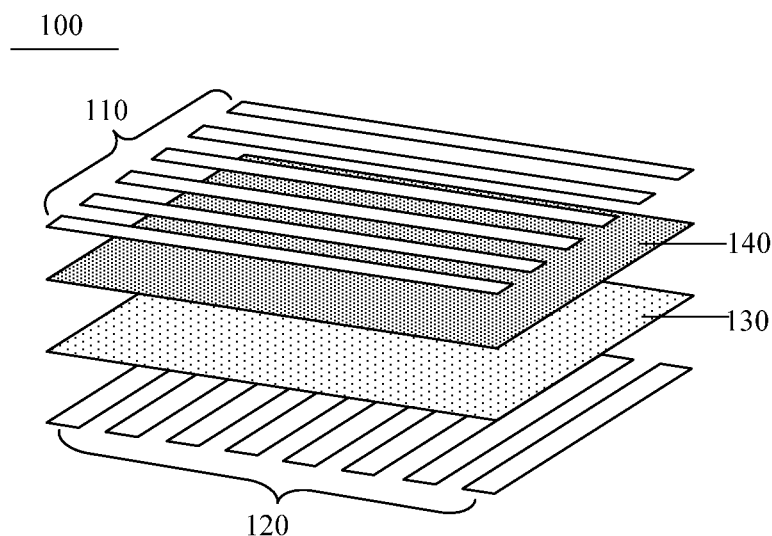
FIG. 4 is a structural schematic diagram II of a force touch sensor provided in an embodiment of the present disclosure.

Optionally, as shown in FIG. 4, the force touch sensor 100 comprises a plurality of driving electrodes 110, each of the driving electrodes 110 extending along a first direction; the force touch sensor 100 comprises a plurality of sensing electrodes 120, each of the sensing electrodes extending along a second direction; and the first direction intersects with the second direction.

Here, both the driving electrode 110 and the sensing electrode 120 may be strip electrodes. Alternatively, both the driving electrode 110 and the sensing electrode 120 are formed by electrically connecting a plurality of rhombus sub-electrodes. Alternatively, both the driving electrode 110 and the sensing electrode 120 are formed by electrically connecting a plurality of cross-shape sub-electrodes. Alternatively, both the driving electrode 110 and the sensing electrode 120 are formed by electrically connecting a plurality of snowflake-shape sub-electrodes.

The above structures are only exemplary examples, and other structures may be used as long as the touch position can be determined through the intersectionally disposed driving electrode 110 and sensing electrode 120.

In the embodiment of the present disclosure, by intersectionally disposing the driving electrode 110 and the sensing electrode 120, when the force touch sensor 100 is applied in a display device, the recognition of the touch position can be achieved based on a mutual capacitance mode, and a multi-point touch can also be achieved.

Optionally, orthographic projections of the piezoelectric material layer 130 and the piezoresistive material layer 140 along a direction perpendicular to the piezoelectric material layer 130 are completely overlapped with each other.

In the embodiment of the present disclosure, by overlapping the piezoelectric material layer 130 and the piezoresistive material layer 140 completely, better touch and pressure sensing effects of the force touch sensor can be achieved.

It should be noted that the material of the piezoresistive material layer 140 is not limited, as long as the resistance of the material can be changed under pressure, and the material is flexible to some extent. For example, the material may be a quantum tunneling composite (QTC), a silicone rubber or the like.

The material of the piezoelectric material layer 130 may preferably include a piezoelectric ceramic material and/or an organic piezoelectric material, due to better piezoelectric performance and some flexibility of the piezoelectric ceramic material and organic piezoelectric material. The piezoelectric ceramic material may be selected from at least one of zinc oxide (ZnO), aluminum nitride (AlN) and lead zirconate titanate; and the organic piezoelectric material may be polyvinylidene fluoride (PVDF).

Figure 5:
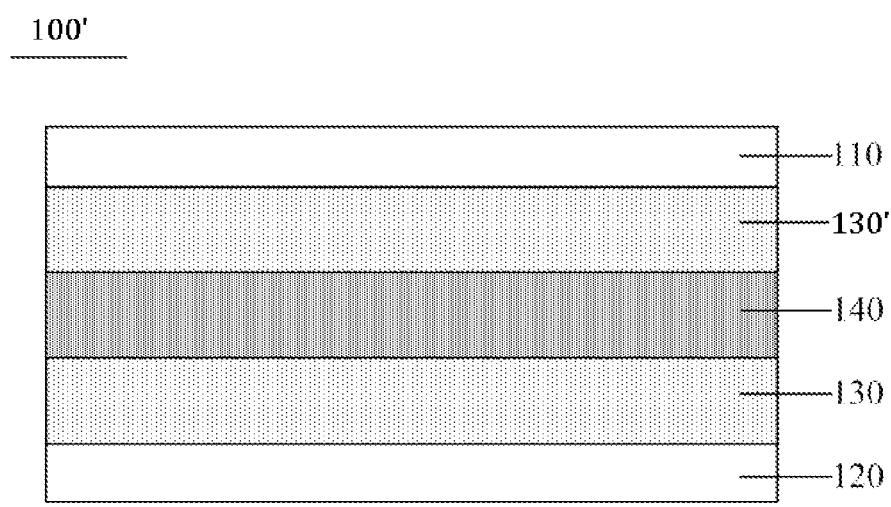
FIG. 5 is a structural schematic diagram of another force touch sensor provided in an embodiment of the present disclosure.

It should be noted that the above description only illustrates the most basic four-layered lamination structure of the force touch sensor as an example. Each of the piezoelectric material layer and the piezoresistive material layer positioned between the driving electrode and the sensing electrode is not limited to one layer only, and a multiple-layered lamination structure with several piezoelectric material layers or piezoresistive material layers may be adopted. FIG. 5 is a schematic diagram of another force touch sensor of the present disclosure, with an alternate lamination structure of piezoelectric material layer/piezoresistive material layer/piezoelectric material layer. As shown in FIG. 5, the force touch sensor 100' comprises a driving electrode 110, a sensing electrode 120, and a piezoelectric material layer 130, a piezoresistive material layer 140 and a piezoelectric material layer 130' disposed between the driving electrode and the sensing electrode. A material of the piezoelectric material layer 130' may be the same as or different from that of the piezoelectric material layer 130.

In the structure shown in FIG. 5, the driving electrode 110 and the sensing electrode 120 correspond to the piezoelectric material layers 130 and 130' respectively, and the piezoresistive material layer 140 is between the two piezoelectric material layers, which can avoid that the pressure induced charges of the piezoelectric material layer is detected in the case of bending so as to generate a bending interference signal. Since the piezoelectric material layer is contacted with the electrode directly, the induced charges generated by pressure is directly detected by the electrode without passing through the piezoresistive material layer, so the magnitude of the pressure signal is increased and the pressure sensing sensitivity can be improved with respect to the basic structure of the four laminated layers.

The embodiments of the present disclosure also provide a display device comprising a display panel and the force touch sensor 100 or the force touch sensor 100' described above. As an example, the display device with the force touch sensor 100 is described below.

The display device of the embodiment of the present disclosure comprises a display panel and the force touch sensor 100 described above, wherein the force touch sensor 100 is disposed on the display panel.

It should be noted that, first, "the force touch sensor 100 is disposed on the display panel" means that the force touch sensor 100 may be integrated into the interior of the display panel or be disposed on an outer surface of the display panel.

Second, the type of the display panel is not limited. For example, the display panel may be a liquid crystal display panel or an organic light emitting diode (OLED) display panel.

Here, when the display panel is a liquid crystal display panel, the force touch sensor 100 may be integrated into the liquid crystal display panel. On this basis, the force touch sensor 100 may be integrated on an array substrate of the liquid crystal display panel or on an aligned cell substrate of the liquid crystal display panel.

Of course, the force touch sensor 100 may also be disposed on an outer surface of the liquid crystal display panel on a light exiting side.

When the display panel is an OLED display panel, the force touch sensor 100 may be integrated into the OLED display panel.

The embodiment of the present disclosure provides a display device. Based on the force touch sensor 100, on one hand, the recognition of the touch position can be achieved by intersectionally disposing the driving electrode 110 and the sensing electrode 120; on the other hand, when the display device is bent, because generally no pressure sensing is performed at this moment, and the overall resistance of the piezoresistive material layer 140 does not decrease (due to the fact that the upper and lower parts of the piezoresistive material layer 140 are subjected to a pulling force and a pressure respectively), therefore, the electrical signal generated by the piezoelectric material layer 130 will not be transmitted to the electrode, thereby it can avoid misrecognition in pressure sensing due to bending.

Optionally, the force touch sensor 100 is integrated into the display panel.

The integration of the force touch sensor 100 into the display panel means that the force touch sensor 100 is fabricated into the interior of the display panel. In this manner, the force touch sensor 100 can be fabricated in the same production line during the manufacture of the display panel, thereby simplifying the process.

Further, because an OLED display panel has advantages of large viewing angle range, uniform image quality, rapid response speed, easy manufacture to be flexible, and the like, the display panel is preferably a flexible OLED display panel.

In this regard, the embodiments of the present disclosure provide several particular structures in which the force touch sensor 100 is integrated into a flexible OLED display panel as follows.

Figure 6:
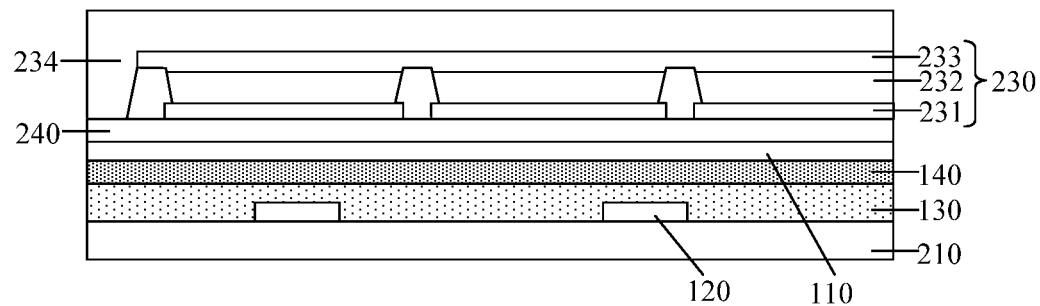
FIG. 6 is a structural schematic diagram I of a display panel provided in an embodiment of the present disclosure.

In a first structure, as shown in FIG. 6, the flexible OLED display panel comprises a flexible substrate 210 and a light emitting device 230 disposed on the flexible substrate 210; and the force touch sensor 100 is disposed on one side of the flexible substrate 210 close to the light emitting device 230.

Here, the light emitting device 230 comprises an anode 231, an organic material function layer 232 and a cathode 233. The organic material function layer 232 may comprises a light emitting layer, an electron transport layer and a hole transport layer. On this basis, in order to increase the efficiency of the injection of electron and hole into the light emitting layer, the organic material function layer 232 may further comprise an electron injection layer disposed between the cathode 233 and the electron transport layer and a hole injection layer disposed between the hole transport layer and the anode 231.

Figure 7:
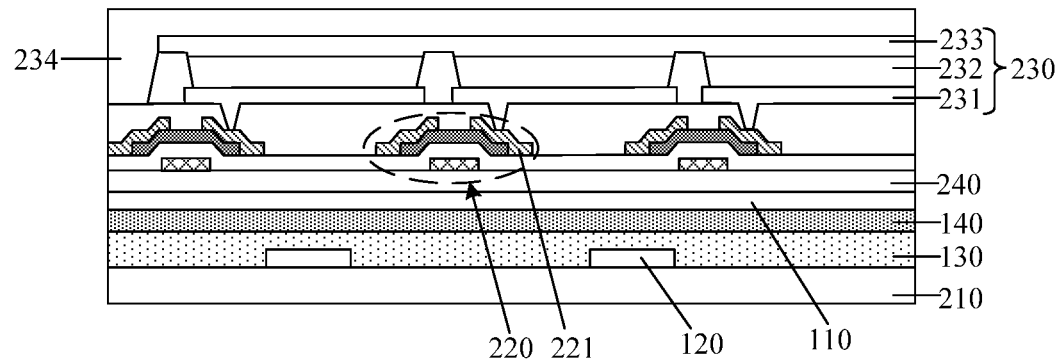
FIG. 7 is a structural schematic diagram II of a display panel provided in an embodiment of the present disclosure.

In a second structure, as shown in FIG. 7, the flexible OLED display panel comprises a flexible substrate 210, a light emitting device 230 disposed on the flexible substrate 210 and a thin film transistor 220 disposed between the flexible substrate 210 and the light emitting device 230; and the force touch sensor 100 may be disposed between the flexible substrate 210 and the thin film transistor 220.

Here, in view of the electrical connection between the drain electrode 221 of the thin film transistor 220 and the anode 231, the anode 231 is typically disposed close to the thin film transistor 220.

Figure 8:
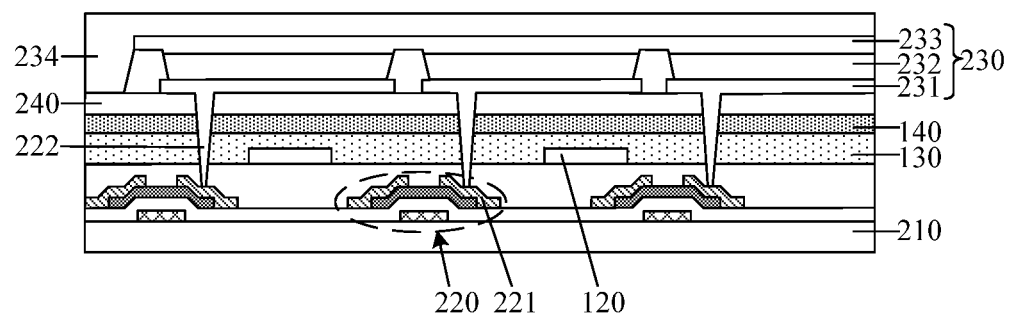
FIG. 8 is a structural schematic diagram III of a display panel provided in an embodiment of the present disclosure.

In a third structure, as shown in FIG. 8, the flexible OLED display panel comprises a flexible substrate 210, a light emitting device 230 disposed on the flexible substrate 210 and a thin film transistor 220 disposed between the flexible substrate 210 and the light emitting device 230; and the force touch sensor 100 is disposed between the thin film transistor 220 and the anode 231 of the light emitting device 230, wherein the sensing electrode 120 is disposed between the piezoelectric material layer 130 and the thin film transistor 220, the driving electrode 110 is disposed between the piezoresistive material layer 140 and the light emitting device 230, and an insulating layer 240 is disposed between the driving electrode 110 and the light emitting device 230; the thin film transistor 220, the force touch sensor 100 and the anode 231 are disposed in lamination, and the anode 231 is electrically connected with the drain electrode 221 of the thin film transistor 220 through a via hole 222.

It should be noted that the via hole 222 extends through the piezoelectric material layer 130 and the piezoresistive material layer 140, but does not contact with the driving electrode 110 and the sensing electrode 120. FIG. 8 shows a section view taken at a gap between two driving electrodes 110, so the driving electrodes 110 are not shown in FIG. 8.

Figure 9:
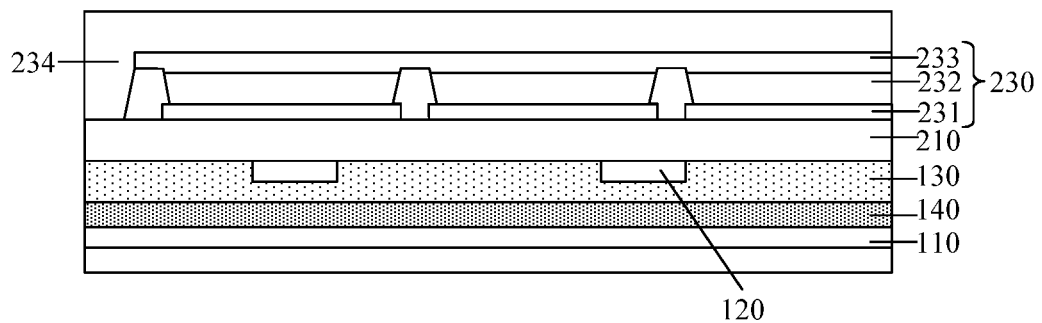
FIG. 9 is a structural schematic diagram IV of a display panel provided in an embodiment of the present disclosure.
Figure 10:
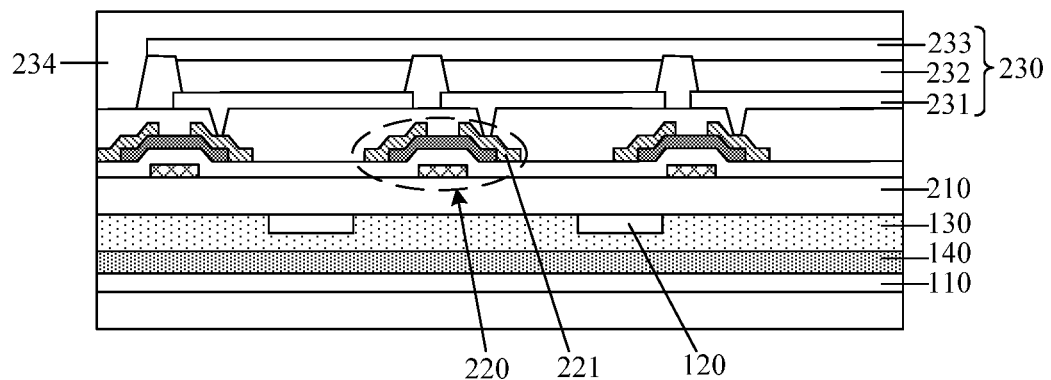
FIG. 10 is a structural schematic diagram V of a display panel provided in an embodiment of the present disclosure.

In a fourth structure, as shown in FIGS. 9 and 10, the force touch sensor 100 is disposed on one side of the flexible substrate 210 away from the light emitting device 230.

On this basis, the flexible OLED display panel may further comprise a protection structure disposed on one side of the force touch sensor 100 away from the flexible substrate 210 to protect the exposed electrode of the force touch sensor 100.

It should be noted that, first, for the first, second and third structures, an insulating layer 240 can be disposed in order to avoid the occurrence of a short circuit between the force touch sensor 100 and the electrode structures of the flexible OLED display panel.

Second, when the flexible OLED display panel is a passive matrix organic light emitting diode (PMOLED) display panel, that is, the flexible OLED display panel does not contain a thin film transistor 220, the relative positions of the anode 231 and the cathode 233 are not limited. On this basis, when a light exits from the side of the flexible substrate 210, the flexible OLED display panel is a bottom light emitting display panel; when the light exits from the side away from the flexible substrate 210, the flexible OLED display panel is a top light emitting display panel; and when the light exits from both the side of the flexible substrate 210 and the side away from the flexible substrate 210 at the same time, the flexible OLED display panel is a two-sides light emitting display panel.

When the flexible OLED display panel is an active matrix organic light emitting diode (AMOLED) display panel, that is, the flexible OLED display panel comprises a thin film transistor 220, the anode 231 is typically disposed close to the thin film transistor 220. Therefore, the flexible OLED display panel can also be classified into a bottom light emitting display panel, a top light emitting display panel, and a two-sides light emitting display panel depending on whether the anode 231 and the cathode 233 are transparent or not.

Third, depending on different light emitting directions of the flexible OLED display panel, it requires that the configuration of the force touch sensor 100 should not influence the normal display of the flexible OLED display panel.

Here, when the force touch sensor 100 is disposed on a light exiting side of the flexible OLED display panel, the force touch sensor 100 is configured to be transparent, or it may be configured such that only the driving electrode 110 and the sensing electrode 120 are transparent, and the piezoelectric material layer 130 and the piezoresistive material layer 140 are disposed in a non-light-emitting area, to ensure that the normal display of the flexible OLED display panel is not influenced.

Of course, despite the configurations of the piezoelectric material layer 130 and the piezoresistive material layer 140, they need to be compatible with the normal use of the force touch sensor 100.

Optionally, the flexible OLED display panel comprises a flexible substrate 210, a light emitting device 230 disposed on the flexible substrate 210 and a packaging thin film 234 and a packaging cover plate 300 for packaging the light emitting device 230; and the force touch sensor 100 is disposed between the packaging thin film 234 and the packaging cover plate 300.

It should be noted that the type of the flexible OLED display panel is not limited, and it can be a flexible AMOLED display panel or a flexible PMOLED display panel. Here, when the flexible OLED display panel is a flexible AMOLED display panel, the flexible OLED display panel may further comprise a thin film transistor 220 disposed on one side of the light emitting device 230 close to the flexible substrate 210.

In the embodiment of the present disclosure, by disposing the force touch sensor 100 between the packaging thin film 234 and the packaging thin film 300, it can avoid the problem that the anode 231 and the cathode 233 shield a capacitance signal generated by the force touch sensor 100, resulting in relatively small signal sensing amount and difficult signal detection. Therefore, on one hand, the detection accuracy can be improved, and on other hand, the problem of difficult signal detection can be solved without additional design.

Figure 11:
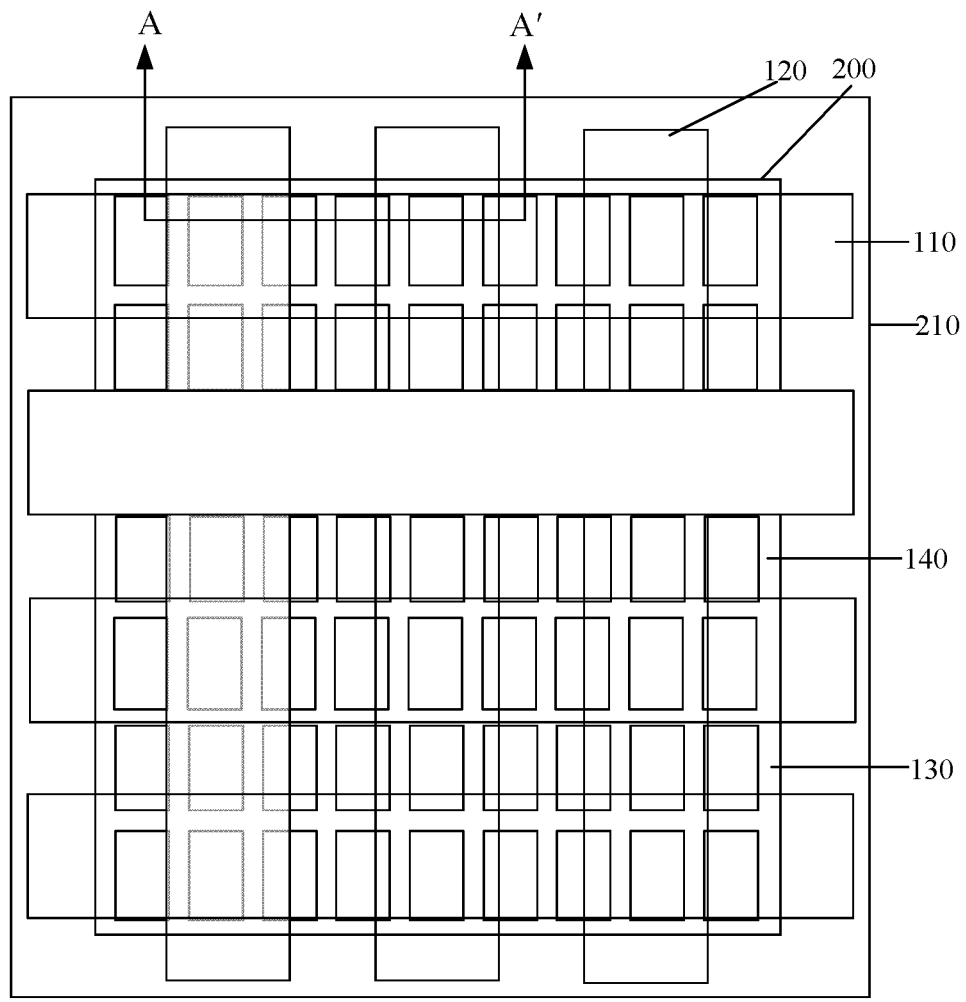
FIG. 11 is a top-view schematic diagram I of a display panel provided in an embodiment of the present disclosure.
Figure 12:
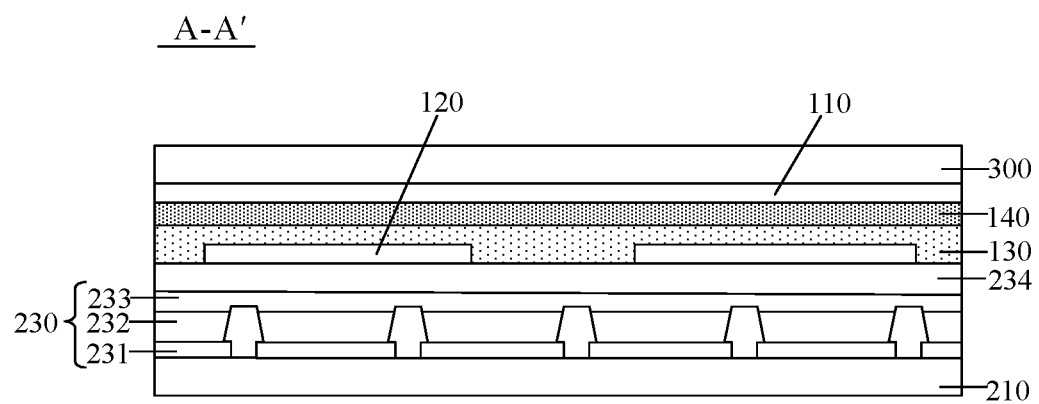
FIG. 12 is a sectional schematic diagram taken along line A-A' in FIG. 11.

At this end, the embodiments of the present disclosure provide two particular structures in which the force touch sensor 100 is disposed between the packaging thin film 234 and the packaging cover plate 300:

A first structure is shown in FIG. 11 and FIG. 12, wherein, the piezoelectric material layer 130 and the piezoresistive material layer 140 are disposed on a display area 200 of the flexible OLED display panel and cover the display area 200.

Here, the force touch sensor 100 is transparent, that is, the materials of the driving electrode 110, the sensing electrode 120, the piezoelectric material layer 130 and the piezoresistive material layer 140 are all transparent materials.

In the embodiment of the present disclosure, the piezoelectric material layer 130 and the piezoresistive material layer 140 cover the display area 200, such that for any touch point, the piezoelectric material layer 130 and the piezoresistive material layer 140 can cover the entire touch position, thereby making the detection more accurate. In addition, since the piezoelectric material layer 130 and the piezoresistive material layer 140 are disposed in a whole layer, the process is simple.

Figure 13:
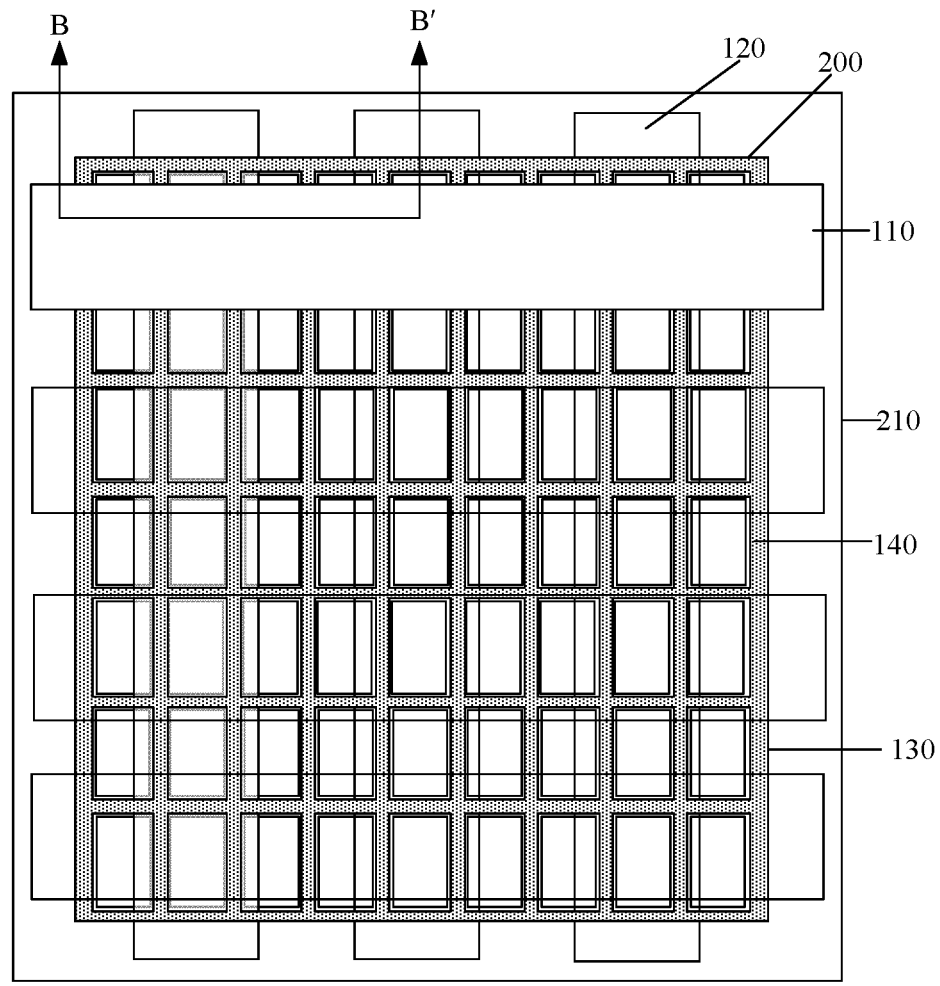
FIG. 13 is a top-view schematic diagram II of a display panel provided in an embodiment of the present disclosure.
Figure 14:
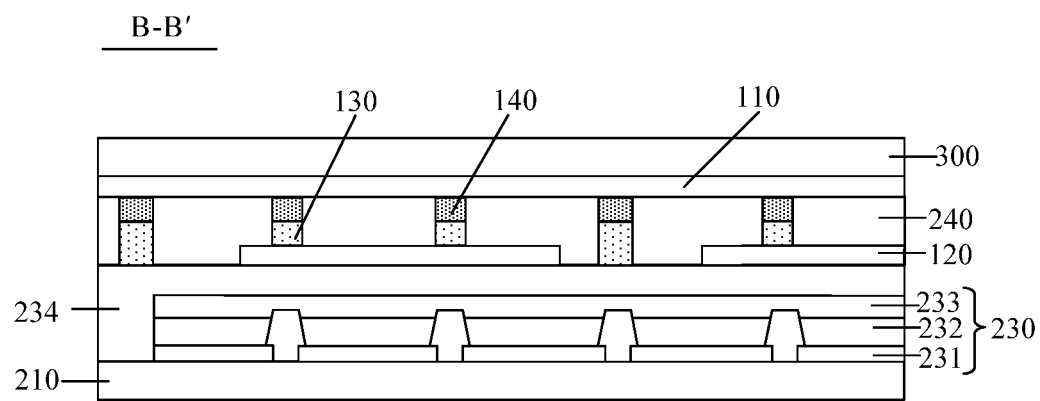
FIG. 14 is a sectional schematic diagram taken along line B-B' in FIG. 13.

A second structure is shown in FIG. 13 and FIG. 14, wherein, the piezoelectric material layer 130 and the piezoresistive material layer 140 are disposed in a non-light-emitting area of the display area 200 and have a network structure; and both the driving electrode 110 and the sensing electrode 120 are transparent electrodes.

Here, in order to avoid a short circuit between the sensing electrode 120 and the driving electrode 110, an insulating layer 240 can be disposed at an area where the sensing electrode 120 and the driving electrode 110 are intersected and no piezoelectric material layer 130 and piezoresistive material layer 140 are disposed.

Here, the materials of the driving electrode 110 and the sensing electrode 120 may be indium tin oxides (ITO) or an organic conductor PEDOT (a polymer of 3,4-ethylenedioxythiophene monomer).

It should be noted that, first, the non-light-emitting area of the display area 200 is a part between sub-pixels in the display area 200, for example, a part sheltered by a black matrix.

Second, the materials of the piezoelectric material layer 130 and the piezoresistive material layer 140 may be transparent materials or opaque materials, and are not particularly limited here.

Third, the piezoelectric material layer 130 and the piezoresistive material layer 140 are configured to have a network structure, and this may also apply to the case where the force touch sensor 100 is integrated into the flexible OLED display panel.

In the embodiment of the present disclosure, the piezoelectric material layer 130 and the piezoresistive material layer 140 are configured to have a network structure, so they may be not limited to transparent layers, as a result, the selection range for the materials of the piezoelectric material layer 130 and the piezoresistive material layer 140 is wider.

Figure 15:
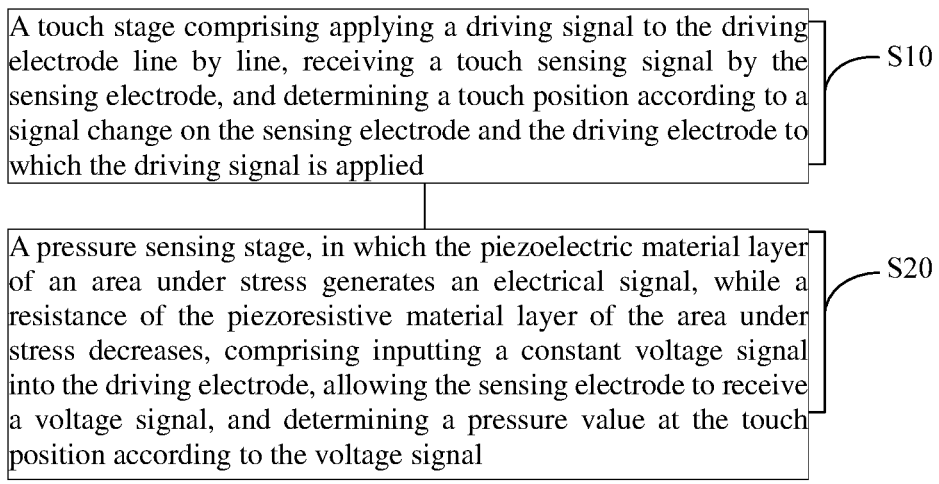
FIG. 15 is a schematic flow chart of a method for driving the display device provided in an embodiment of the present disclosure.
Figure 16:
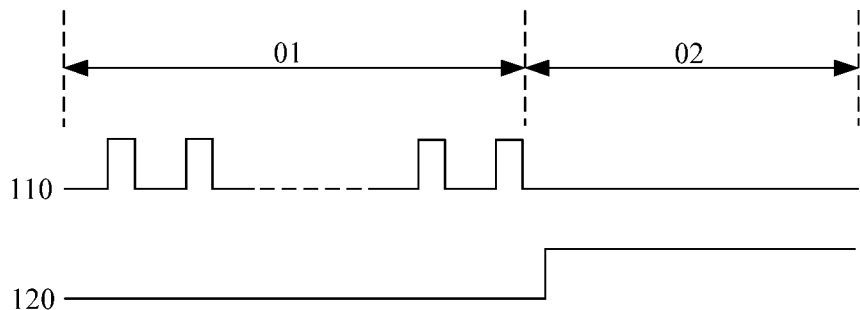
FIG. 16 is a schematic time sequence diagram for driving the display device provided in an embodiment of the present disclosure.

The embodiments of the present disclosure further provide a method for driving the display device described above, as shown in FIG. 15, comprising:

S10: a touch stage 01 as shown in FIG. 16, at which stage a driving signal is applied to the driving electrode 110 line by line, the sensing electrode 120 receives a touch sensing signal, and a touch position is determined according to a signal change on the sensing electrode 120 and the driving electrode 110 to which the driving signal is applied.

It should be noted that, when the intensity of the touch is relatively great, because of decreased resistance of the piezoresistive material layer 140 in the area under stress and the presence of equivalent voltage source, the sensing signal received by the sensing electrode 120 includes not only touch signal due to finger touch (change in charge amount) but also pressure induced signal due to pressure (pressure induced charge), such that the sensing signal received by the sensing electrode 120 is enhanced without influencing the determination on the touch position.

S20: a pressure sensing stage 02, at which stage, the piezoelectric material layer 130 of an area under stress generates an electrical signal, while a resistance of the piezoresistive material layer 140 of the area under stress decreases, a constant voltage signal is input into the driving electrode 110, the sensing electrode 120 is allowed to receive a voltage signal, and a pressure value at the touch position is determined according to the voltage signal.

Here, the pressure sensing stage 02 follows the touch stage 01.

It should be noted that the durations of the touch stage 01 and the pressure sensing stage 02 can be suitably adjusted depending on the processing function of the IC chip, and are not particularly limited herein. For example, the duration of the touch stage 01 may be 11.7 ms. On this basis, the duration of the pressure sensing stage 02 may be 5 ms.

In the embodiment of the present disclosure, at the touch stage 01, a driving signal is applied to the driving electrode 110, and a touch position is determined according to a sensing signal received by the sensing electrode 120. At this moment, whether the force is great or small, the recognition of the touch position based on capacitance change will not be influenced. On the other hand, at the pressure sensing stage 02, when a pressure is applied to the display device, positive and negative charges are generated on the top and bottom surfaces of the piezoelectric material layer 130 respectively, and the resistance of the piezoresistive material layer 140 decreases; at this moment, a constant voltage signal is input into the driving electrode 110 and the sensing electrode 120 is allowed to receive a voltage signal, and a pressure value at the touch position is determined according to the voltage signal. Here, when the display device is bent, although positive and negative charges are generated on the top and bottom surfaces of the piezoelectric material layer 130 respectively, the voltage signal will not be received by the sensing electrode 120, because no touch operation is performed on the display device at this moment and the overall resistance of the piezoresistive material layer 140 will not decrease as the upper and lower parts of the piezoresistive material layer 140 are subjected to a pulling force and a pressure respectively. Therefore, it can avoid misrecognition in pressure sensing.

The above descriptions are only some particular embodiments of the present disclosure, but the protection scope of the present application is not limited thereto. Within the technical scope disclosed in the present disclosure, one skilled in the art can readily envisage variations and alternatives, and all of them are covered by the protection scope of the present application. Therefore, the protection scope of the present application is defined by the claims.

What is claimed is:

1. A force touch sensor comprising a driving electrode, a sensing electrode, a plurality of piezoelectric material layers and at least one piezoresistive material layer, wherein,
   the plurality of piezoelectric material layers and the at least one piezoresistive material layer are disposed between the driving electrode and the sensing electrode; and
   the force touch sensor has a structure in which the driving electrode, a first one of the piezoelectric material layers, the piezoresistive material layer, a second one of the piezoelectric material layers and the sensing electrode are laminated in sequence.

2. The force touch sensor according to claim 1, wherein, the force touch sensor comprises a plurality of driving electrodes, each of which extends along a first direction; and the force touch sensor comprises a plurality of sensing electrodes, each of which extends along a second direction; wherein the first direction intersects with the second direction.

3. The force touch sensor according to claim 1, wherein, orthographic projections of the piezoelectric material layers and the piezoresistive material layer along a direction perpendicular to the piezoelectric material layer are completely overlapped with each other.

4. The force touch sensor according to claim 1, wherein, a material of the piezoelectric material layers includes a piezoelectric ceramic material and/or an organic piezoelectric material.

5. The force touch sensor according to claim 1, wherein, a material of the piezoelectric material layers includes a piezoelectric ceramic material that includes at least one selected from the group consisting of zinc oxide, aluminum nitride and lead zirconate titanate; and the organic piezoelectric material includes polyvinylidene fluoride.

6. A display device comprising a display panel and the force touch sensor according to claim 1, wherein the force touch sensor is disposed on the display panel.

7. The display device according to claim 6, wherein, the force touch sensor is integrated into the display panel.

8. The display device according to claim 7, wherein, the display panel is a flexible organic light emitting diode display panel.

9. The display device according to claim 8, wherein, the flexible organic light emitting diode display panel comprises a flexible substrate and a light emitting device disposed on the flexible substrate; and
   the force touch sensor is disposed on one side of the flexible substrate close to the light emitting device.

10. The display device according to claim 8, wherein, the flexible organic light emitting diode display panel comprises a flexible substrate and a light emitting device disposed on the flexible substrate; and
    the force touch sensor is disposed on one side of the flexible substrate away from the light emitting device.

11. The display device according to claim 8, wherein, the flexible organic light emitting diode display panel comprises a flexible substrate, a light emitting device disposed on the flexible substrate, and a thin film transistor disposed between the flexible substrate and the light emitting device; and the force touch sensor is disposed between the flexible substrate and the thin film transistor.

12. The display device according to claim 8, wherein, the flexible organic light emitting diode display panel comprises a flexible substrate, a light emitting device disposed on the flexible substrate and a thin film transistor disposed between the flexible substrate and the light emitting device; and the light emitting device comprises an anode, an organic material function layer and a cathode;

the force touch sensor is disposed between the thin film transistor and the anode; the thin film transistor, the force touch sensor and the anode are disposed in lamination, and the anode is electrically connected with a drain electrode of the thin film transistor through a via hole.

13. The display device according to claim 8, wherein, the flexible organic light emitting diode display panel comprises a flexible substrate, a light emitting device disposed on the flexible substrate and a packaging thin film and a packaging cover plate for packaging the light emitting device; and the force touch sensor is disposed between the packaging thin film and the packaging cover plate.

14. The display device according to claim 13, wherein, the piezoelectric material layers and the piezoresistive material layer are disposed on a display area of the flexible organic light emitting diode display panel and cover the display area; and the force touch sensor is transparent.

15. The display device according to claim 13, wherein, the piezoelectric material layers and the piezoresistive material layer are disposed on a non-light-emitting area of the display area and have a network structure; and both the driving electrode and the sensing electrode are transparent electrodes.

16. A method for driving a display device, wherein the display device comprises a display panel and a force touch sensor disposed on the display panel, said force touch sensor comprising a driving electrode, a sensing electrode, a piezoelectric material layer and a piezoresistive material layer, with the piezoelectric material layer and the piezoresistive material layer being disposed between the driving electrode and the sensing electrode, the method comprising:

a touch stage, comprising applying a driving signal to the driving electrode line by line, receiving a touch sensing signal by the sensing electrode, and determining a touch position according to a signal change on the sensing electrode and the driving electrode to which the driving signal is applied; and a pressure sensing stage, in which the piezoelectric material layer of an area under stress generates an electrical signal, while a resistance of the piezoresistive material layer of the area under stress decreases, comprising inputting a constant voltage signal into the driving electrode, allowing the sensing electrode to receive a voltage signal, and determining a pressure value at the touch position according to the voltage signal.

17. A display device comprising a display panel and a force touch sensor disposed on the display panel, wherein the force touch sensor comprises a driving electrode, a sensing electrode, a piezoelectric material layer and a piezoresistive material layer, with the piezoelectric material layer and the piezoresistive material layer being disposed between the driving electrode and the sensing electrode;

wherein the force touch sensor is integrated into the display panel;

wherein the display panel is a flexible organic light emitting diode display panel;

wherein the flexible organic light emitting diode display panel comprises a flexible substrate, a light emitting device disposed on the flexible substrate and a thin film transistor disposed between the flexible substrate and the light emitting device; and the light emitting device comprises an anode, an organic material function layer and a cathode; and wherein the force touch sensor is disposed between the thin film transistor and the anode; the thin film transistor, the force touch sensor and the anode are disposed in lamination, and the anode is electrically connected with a drain electrode of the thin film transistor through a via hole.

* * * * *